(12) United States Patent
Guenther et al.

(10) Patent No.: US 6,193,069 B1
(45) Date of Patent: Feb. 27, 2001

(54) APPARATUS FOR PACKAGING PROCESSING SYSTEM ELEMENTS FOR MAILING AND SHIPPING

(75) Inventors: John L. Guenther, Aptos; Donald D. Campbell; Brian D. Perry, both of San Jose, all of CA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/296,941

(22) Filed: Apr. 22, 1999

(51) Int. Cl.[7] ................................................ B65D 85/30
(52) U.S. Cl. ........................ 206/723; 206/722; 206/706
(58) Field of Search ................................. 206/701, 706, 206/721, 722, 723

(56) References Cited

U.S. PATENT DOCUMENTS 4,564,880 * 1/1986 Christ et al. ..................... 206/723 X
4,815,596 * 3/1989 Reid ..................................... 206/723

* cited by examiner

Primary Examiner—David T. Fidei
(74) Attorney, Agent, or Firm—Oppenheimer Wolff & Donnelly LLP

(57) ABSTRACT

The present invention provides integrated packaging for storing or transporting a circuit assembly. In an embodiment of the invention, a housing comprises a first side portion attached to the circuit assembly, a second side portion and means for coupling the first side portion to the second side portion wherein the second side portion is moveable to a first position when the circuit assembly is operating and the second side portion is moveable to a second position when the circuit assembly is to be transported, so that the housing encloses the circuit assembly.

20 Claims, 6 Drawing Sheets

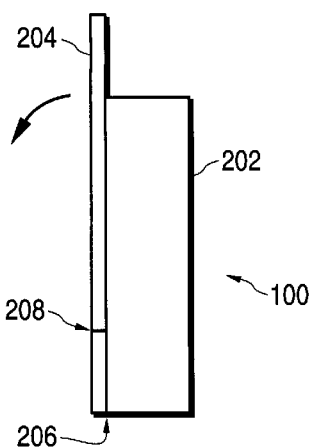
FIG.5A
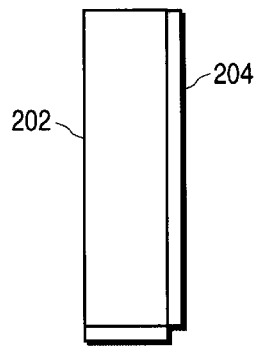
FIG.5F
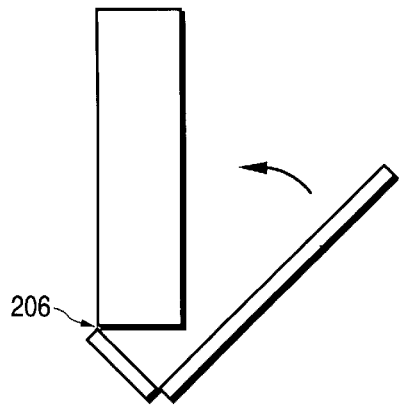
FIG.5E
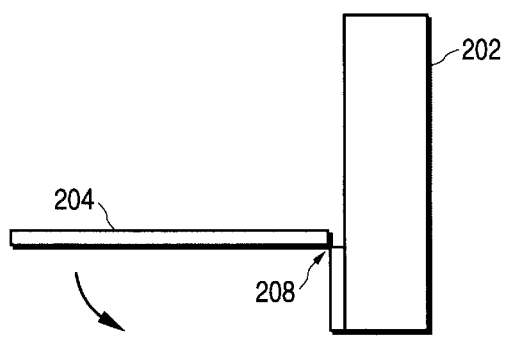
FIG.5B
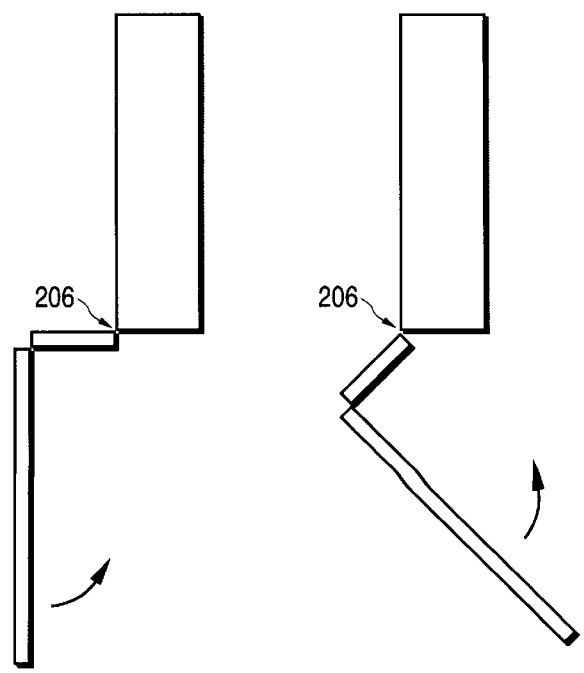
FIG.5C     FIG.5D

APPARATUS FOR PACKAGING PROCESSING SYSTEM ELEMENTS FOR MAILING AND SHIPPING

FIELD OF THE INVENTION

This invention relates generally to the field of packaging, and more specifically, to integrated packaging for use with an electronic assembly.

BACKGROUND OF THE INVENTION

The widespread use of computer processing systems has resulted in many new system designs being created to satisfy user requirements relative to size, cost and ease of use. For example, computer system designs include mainframes, workstations, desktops, towers, notebooks and many more. Business organizations have migrated to centralized processing systems having a distribution of workstations networked together to form a cohesive work environment. However, centralized processing systems have large, expensive and complicated circuitry which may be difficult to repair and expensive to replace. Also, system failures can bring the entire network down resulting in loss of time and worker productivity. As a result, there is a demand for systems that are easy and cost effective to repair and maintain.

Recent developments in computer processing systems have focused on modularization as a way to provide cost effective repair and maintenance. This is a technique where the computer hardware is divided into groups of hardware components which may be placed on small printed circuit cards sometimes referred to as circuit assemblies. Each circuit assembly may perform one or more processing functions. A rack or card cage is used as a means to connect the circuit assemblies into the complete processing system. The card cage has an interconnected backplane so that when the circuit assemblies are installed into it, the required interconnectivity is provided to operate the processing system.

FIG. 1 shows a typical circuit assembly 100 which may form part of a processing system. The circuit assembly comprises a printed circuit board 102, processing components 104,106 and a connector 108. The printed circuit card has within it interconnections which electrically connect the components and the connector together. The connector provides input and output signals and power connections so that when the assembly is installed in a card cage, the circuit assembly is activated and may interact with the other installed circuit assemblies to function as a complete processing system.

Modularization of computer processing systems provides many benefits. The smaller card assemblies are easy to design and manufacture. Repair of these systems is also easier since problems need only be diagnosed to determine which assembly is defective. The problem can then be resolved by simply replacing the defective circuit assembly at a relatively cheap cost. As a result, the level of skill and knowledge required of repair technicians continues to decrease.

Eventually, it will become more cost effective to have the user of the processing system repair the problems when they occur. However, for a number of reasons, this is not currently a practical alternative. To begin with, the circuit assemblies are delicate. Untrained users handling the printed circuit assemblies may physically damage components or produce electrical damage through electrostatic discharge. Inventory is also a problem. Due to cost and space considerations, users may not be able to keep an inventory of spare circuit assemblies. Finally, even if a user could determine a circuit assembly needing replacement, arranging for packaging and shipment back to the factory could result in further damage or shipping problems, thereby extending the time and cost of repair.

To facilitate the use of modular processing systems and thereby allow users to self-repair problems that occur, what is needed is an improved way to package circuit assemblies. The new packaging should be strong but lightweight and be integrated as a part of the circuit assembly. The packaging should allow the circuit assembly to be installed into a card cage to function as part of a processing system. Additionally, when the circuit assembly is removed from the card cage, the packaging should convert to form an enclosed housing for the circuit assembly. This would allow the circuit assembly to be safely stored, shipped, mailed or otherwise transported. Materials used for the packaging should be non-conductive to protect the circuit assembly from electrostatic discharge. A preprinted label should also be incorporated to contain information descriptive of the circuit assemble or mailing and shipping instructions.

SUMMARY OF THE INVENTION

The present invention provides integrated packaging for storing or transporting a circuit assembly. In an embodiment of the invention, a housing comprises a first side portion attached to the circuit assembly, a second side portion and means for coupling the first side portion to the second side portion wherein the second side portion is moveable to a first position when the circuit assembly is to be operated and the second side portion is moveable to a second position when the circuit assembly is to be transported, so that when said second side portion is in the second position the housing encloses the circuit assembly.

BRIEF DESCRIPTION OF THE DRAWINGS

FIGS. 5a–f shows top views of an embodiment of the present invention; and

DESCRIPTION OF THE SPECIFIC EMBODIMENTS

Figure 1:
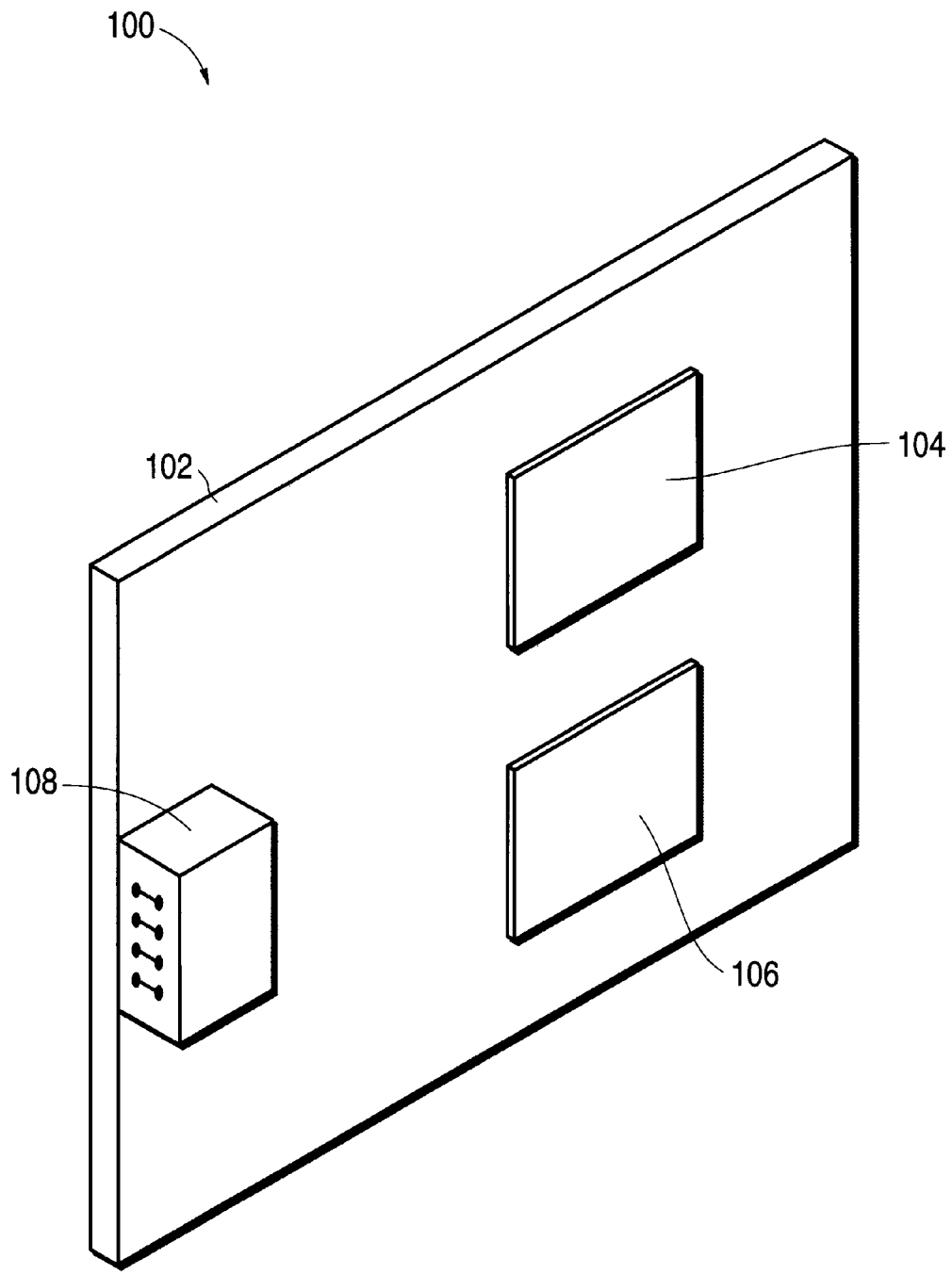
FIG. 1 shows a typical electronic assembly.
Figure 2:
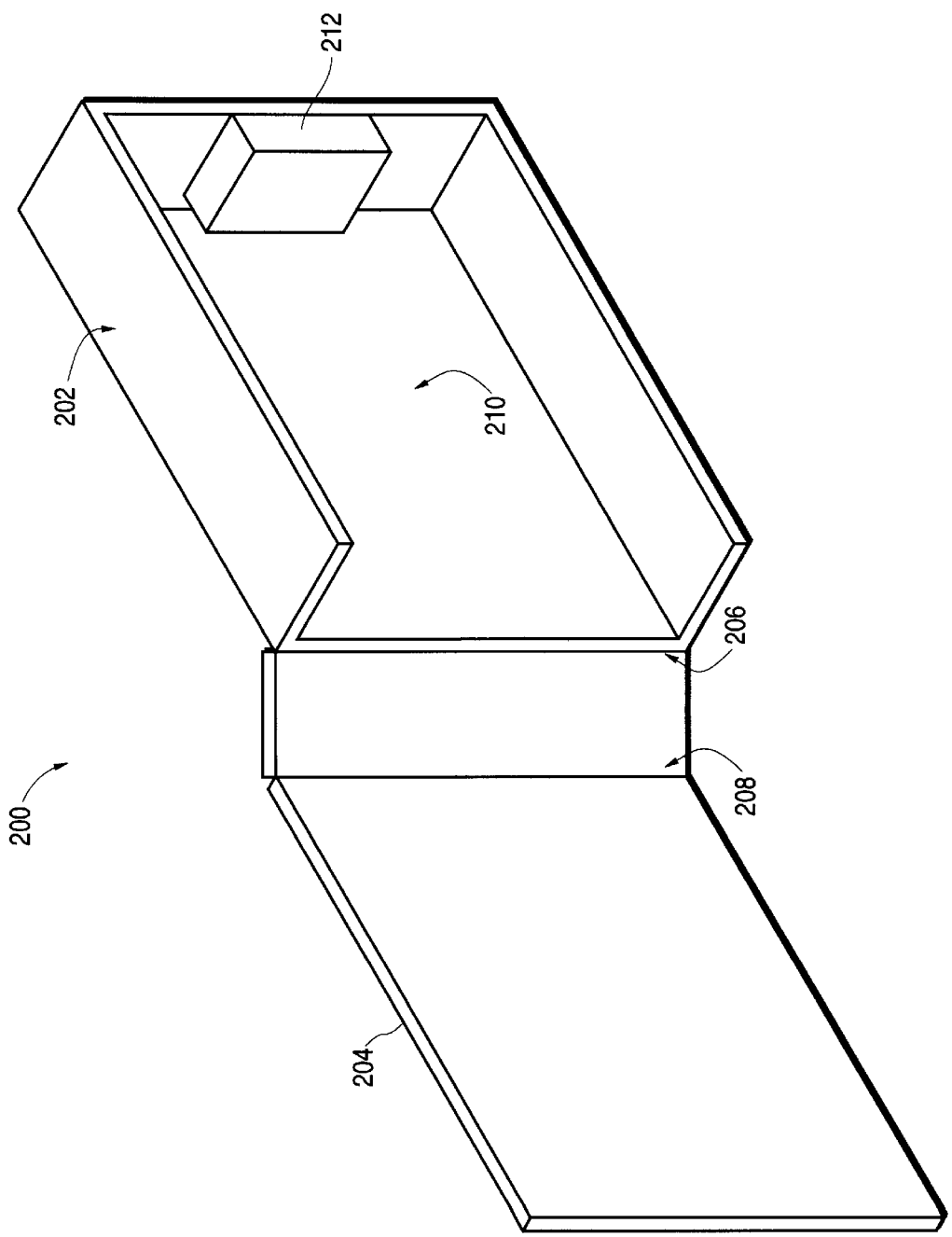
FIG. 2 shows an embodiment of the present invention.

FIG. 2 shows a housing 200 constructed according to the teachings of the present invention. In this embodiment of the invention, the housing 200 is constructed from a material which can be bent or formed into a rigid structure, such as corrugated cardboard. As will be shown, many materials having the required strength, weight and flexibility can be used to construct an embodiment of the invention.

Housing 200 is comprised of a frame 202 and a cover 204. A flexible hinge 206 joins the frame 202 and the cover 204 together. A flexible joint 208 in the cover 204 is also provided. In one embodiment, wherein the housing is constructed from cardboard, the flexible hinge and flexible joint are formed by cutting or scoring the cardboard on one or more surfaces. This creates hinge and joint features which allow the cardboard to easily bend along the scoring without breaking. In other embodiments the flexible hinge and flexible joint may be formed using other methods based on the material chosen for the housing. For example, a portion of plastic may have a thin region allowing the plastic enough flexibility to be folded along the thin region without breaking. In another example, the cover may be formed of two piece of a material that may be joined with tape or glue to form a flexible hinge. The flexible hinge 206 and the flexible joint 208 allow the cover 204 to move into various positions relative to the frame 202.

Frame 202 has a mounting surface 210 that can be used attach to a circuit assembly, such as the circuit assembly 100, into the frame 202. Frame 202 also has a securing block 212 which can be used to secure the circuit assembly to the mounting surface 210.

Figure 3:
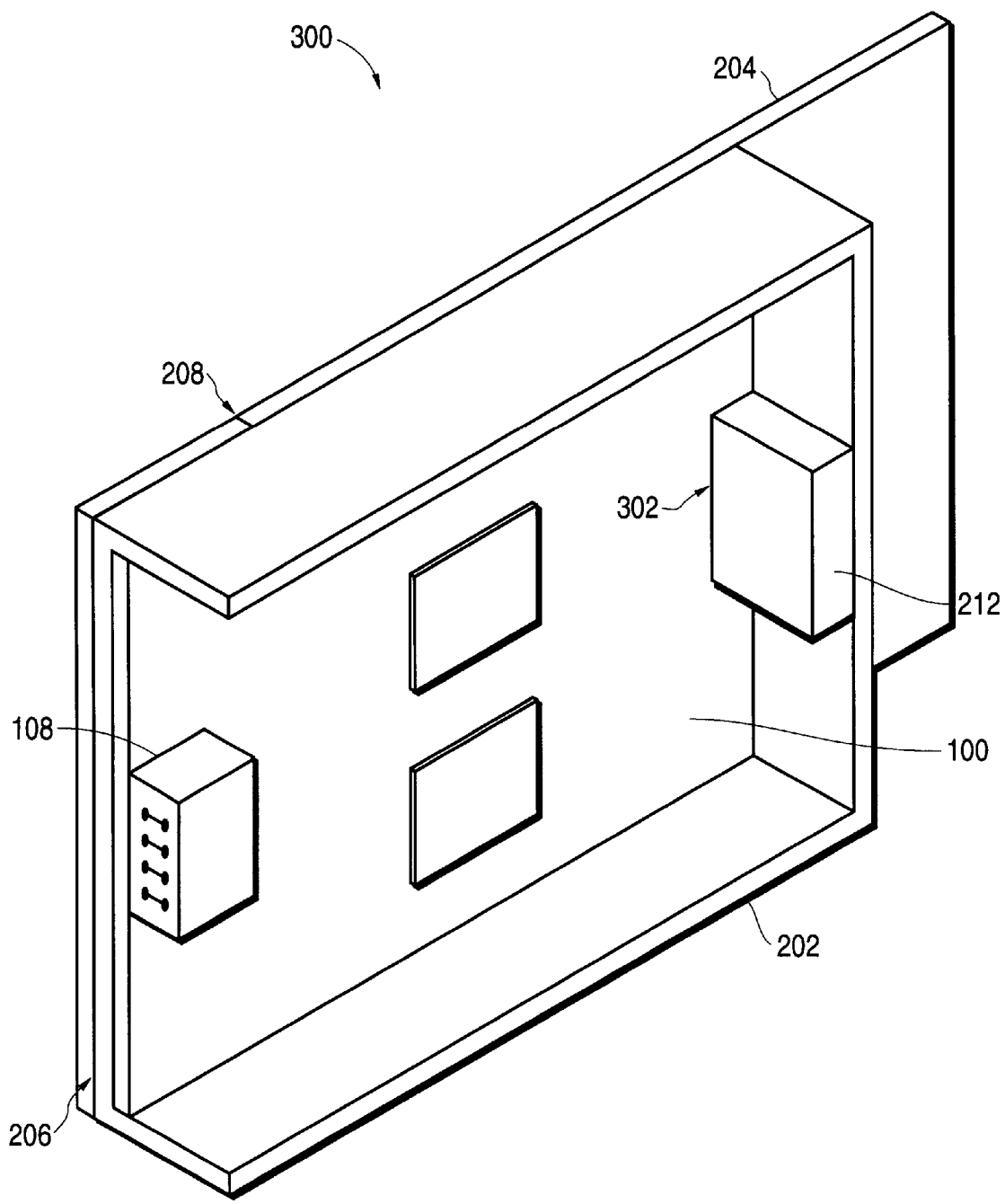
FIG. 3 shows an embodiment of the present invention is an open position.

Referring now to FIG. 3, therein is depicted an embodiment 300 of the present invention wherein the circuit assembly 100 is attached to the mounting surface 210 (not visible) of the frame 202. The circuit assembly is held into place against the mounting surface by the securing block 212 as shown at 302. While the securing block is used in this embodiment, other mounting techniques could be used to secure the circuit assembly to the mounting surface. For example, adhesives, glues, fasteners or tape may be used. In another embodiment, the frame is made slightly smaller than the circuit assembly so that the circuit assembly may be press fit into position.

In FIG. 3 the cover 204 is shown in an open position. In the open position the cover is folded back so that it is completely adjacent to the underside of the mounting surface. The use of flexible hinge 206 allows the cover to be moved into this position. Flexible joint 208 is shown but is not flexed so that the cover may lie flat against the underside of the mounting surface. The open position exposes the connector 108 so that it may be connected to a processing system allowing operation of the circuit assembly. Frame 202 is constructed from non-conductive materials, such as cardboard, so that the mounting surface does not electrically short together signals or components on the underside of the circuit assembly.

Figure 4:
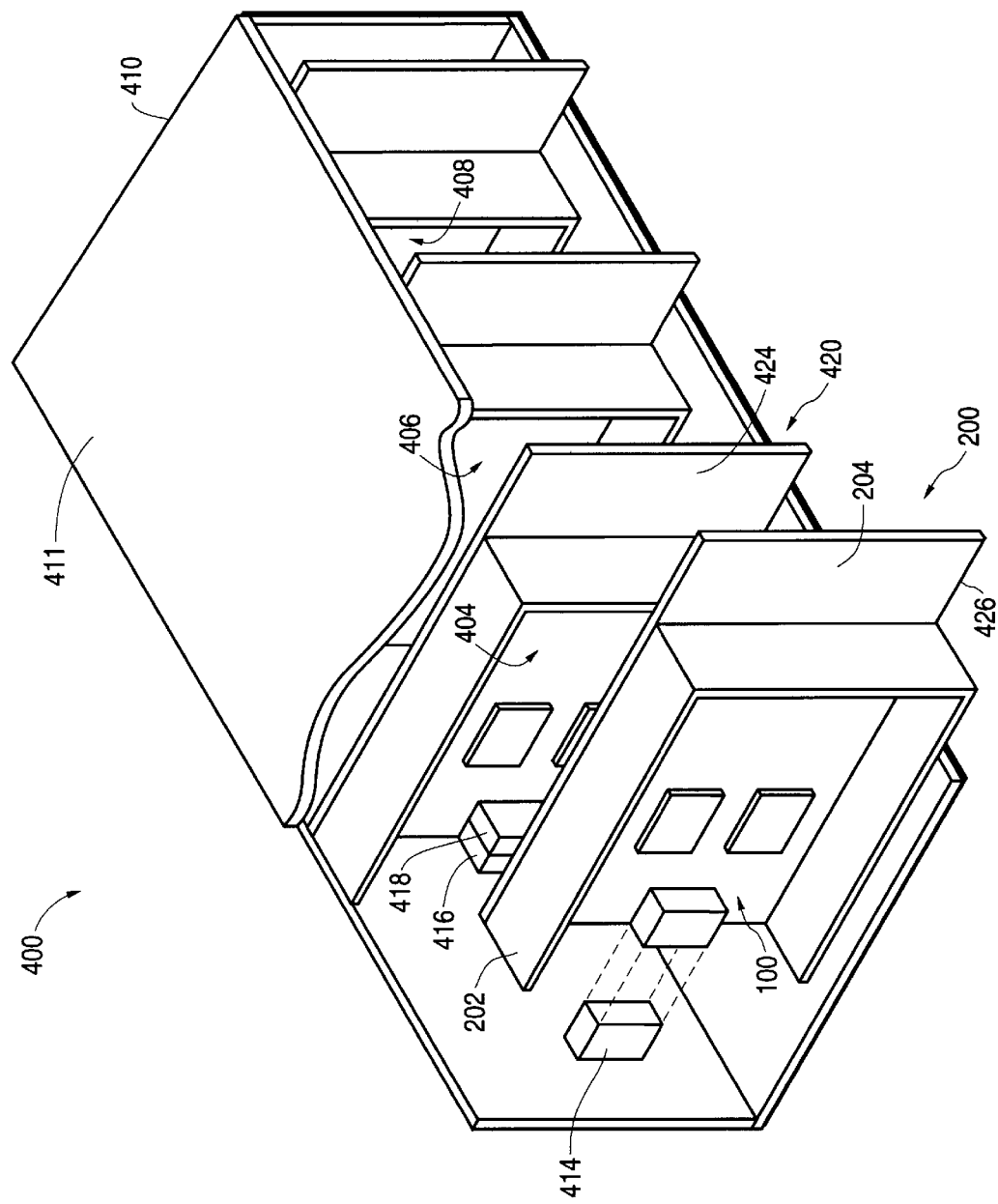
FIG. 4 shows an embodiment of the present invention used within a processing system card cage.

FIG. 4 shows a processing system 400 wherein four circuit assembly cards 100, 404, 406 and 408 are to be installed into a processing system card cage 410. The card cage is shown with a top portion 411 having a cut-away 412 to allow system connectors 414, 416 to be viewed. As can be seen from the figure, circuit assembly 404 is positioned in the card cage so that card cage connector 416 connects to circuit assembly connector 418. Circuit assembly 404 is mounted into housing 420 which is also constructed according to the teachings of the present invention. The housing 420 has a frame 422 and a cover 424. Circuit assemblies 406 and 408 are positioned in the card cage in a like manner to circuit assembly 404.

Circuit assembly 100 is shown mounted into housing 200 with the cover 204 in the open position relative to the frame 202. Connector 108 is shown in alignment with the system connector 414. As a result of placing cover 204 in the open position, when circuit assembly 100 is pushed into the card cage, connector 108 is accessible to mate with system connector 414 forming an electrical connection. This will allow circuit assembly 100 to operate within processing system 400 together with circuit assemblies 404, 406 and 408. In the open position, the cover 204 also form an extension structure 426 which a user can grasp for easy removal of circuit assembly 100 from the card cage.

An attachment is provided, but not shown in the drawing, to attach the cover to the frame when the cover is in the opened position. The attachment consists of a snap mechanism wherein a first portion of the snap mechanism is mounted on the frame and a second portion is mounted on the cover. When the cover is in the opened position, the two portions of the snap mechanism align and may be detachably joined to form a firm connection holding the cover to the frame. Other methods may be used to attach the cover to the frame such as tape, velcro, tab and slot or other latching mechanisms.

FIGS. 5a–f show a top view 500 of the housing 200 as cover 204 is moved from the open position to the closed position. In FIG. 5a the top view 500 shows the housing 200, frame 202, flexible joint 208, flexible hinge 206 and cover 204 in the open position. Not visible in the top view 500 is the circuit assembly 100 contained within the frame 202. FIG. 5b shows the housing wherein the cover 204 is move counterclockwise away from the frame 202 by utilizing the flexible joint 208. Fig 5c. shows the housing wherein the cover is moved further in a counterclockwise direction utilizing the flexible hinge 206. FIGS. 5d and 5e show the housing wherein the cover is moved still further in a counterclockwise direction utilizing the flexible hinge 206. FIG. 5f shows the housing wherein the cover 204 is moved completely to the closed position relative to the frame 202 and thereby forming an enclosure which completely encloses the circuit assembly.

Figure 6:
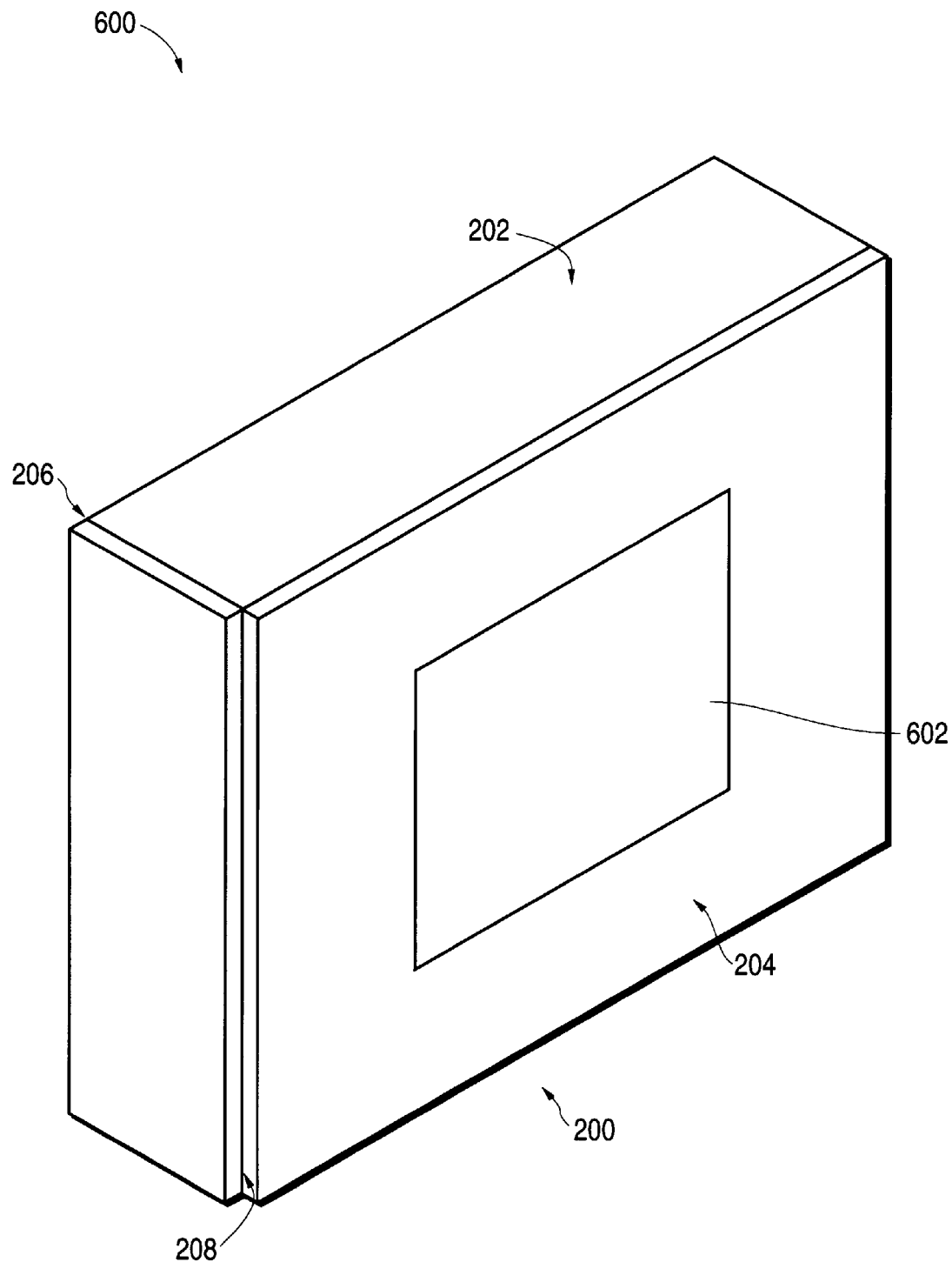
FIG. 6 shows an embodiment of the present invention is a closed position.

FIG. 6 shows a view 600 of the housing 200 in a closed position. In the closed position, the cover 204 is folded onto the frame 202 so that the circuit assembly (not visible) is completely enclosed within the housing. This is accomplished by folding the cover 204 relative to the frame 202 using flexible hinge 206 and flexible joint 208. In the closed position the circuit assembly is protected so that it may be transported safely without damage. In addition, the housing may act as a conductive insulator preventing electrical damage to the circuit assembly by static discharge. When the cover 204 is folded, a label 602 becomes visible on the outside surface of the housing. The label may be descriptive of the circuit assembly, may contain storage instructions or may be a preprinted mailing or shipping label allowing the circuit assembly to be mailed or shipped without expense to the sender. An attachment is provided, but not shown in the drawing, to attach the cover to the frame when the cover is in the closed position. The attachment consists of a snap mechanism wherein a first portion of the snap mechanism is mounted on the frame and a second portion is mounted on the cover. When the cover is in the closed position, the two portions of the snap mechanism align and may be detachably joined to form a firm connection holding the cover to the frame. Other methods may be used to attach the cover to the frame such as tape, velcro, tab and slot or other latching mechanisms.

As can be seen, housing 200, constructed according to the teachings of the present invention, provides a convenient and easy to use packaging apparatus for the storage and transportation of circuit assemblies. As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A housing for transporting a circuit assembly comprising:
    a first side portion that includes an attachment means to attach said first side portion to the circuit assembly, wherein said first side portion and said attachment means are comprised of a non-conductive material;

a second side portion; and a hinge means coupled between said first side portion and said second side portion, said hinge means allows said second side portion to move to open and closed positions relative to said first side portion, wherein when said second side portion is in the closed position the housing completely encloses the circuit assembly, and wherein when the second side portion is in the open position, the first side portion remains attached to the circuit assembly, and at least a portion of the circuit assembly is accessible to allow operation of the circuit assembly.

2. The housing of claim 1 wherein the circuit assembly comprises an edge portion with at least one connector coupled to said edge portion and wherein when said second side portion is in said open position said at least one connector becomes accessible for connecting.

3. The housing of claim 1 wherein said housing is comprised of a cardboard material.

4. The housing of claim 1 wherein said housing is comprised of a plastic material.

5. The housing of claim 1 wherein said attachment means comprises a mounting block attached to the first side portion to secure the circuit assembly to the first side portion.

6. The housing of claim 1 further comprising;

at least one external surface that is visible when said second side portion is in said closed position; and a label located on said at least one external surface.

7. The housing of claim 1 further comprising;

a fastener for detachably connecting said first side portion to said second side portion when said second side portion is in said opened position.

8. The housing of claim 1 further comprising;

a fastener for detachably connecting said first side portion to said second side portion when said second side portion is in said closed position.

9. The housing of claim 1, wherein said attachment means comprises an adhesive coupled between the first side portion and the circuit assembly.

10. The housing of claim 1, wherein said attachment means comprises a fastener that secures the first side portion and the circuit assembly.

11. A circuit module comprising:

a circuit assembly;

a first housing portion that includes an attachment means to attached said first housing portion to the circuit assembly;

a second housing portion;

a third housing portion;

a first hinge means coupled to said first housing portion and said second housing portion; and a second hinge means coupled to said second housing portion and said third housing portion, wherein said first and second hinge means allows said second and third housing portions to move to open and closed positions relative to said first housing portion, wherein when said second and third housing portions are in the closed position said first housing portion, said second housing portion and said third housing portion completely enclose the circuit assembly, and wherein when said second and third housing portions are in the open position, the first housing portion remains attached to the circuit assembly, and at least a portion of the circuit assembly is accessible.

12. The circuit module of claim 11 wherein the circuit assembly comprises an edge portion with at least one connector coupled to said edge portion and wherein when said second and third housing portions are in said open position said at least one connector becomes accessible for connecting, and wherein when said second and third housing portions are in said closed position said at least one connector becomes inaccessible for connecting.

13. The circuit module of claim 11 wherein said first, second and third housing portions are comprised of a non-conductive material.

14. The circuit module of claim 13, wherein the non-conductive material is a cardboard material.

15. The circuit module of claim 13, wherein the non-conductive material is a plastic material.

16. The circuit module of claim 11, wherein said attachment means comprises a mounting block to attach the circuit assembly to the first housing portion.

17. The housing of claim 11 further comprising;

at least one external surface which is visible when said second housing portion is in said closed position; and a label located on said at least one external surface.

18. The housing of claim 11 further comprising;

a fastener for detachably connecting said first housing portion to said third housing portion when said third housing portion is in said opened position.

19. The housing of claim 11 further comprising;

a fastener for detachably connecting said first housing portion to said third housing portion when said third housing portion is in said closed position.

20. The circuit module of claim 11, wherein said attachment means comprises an adhesive to attach the circuit assembly to the first housing portion.

* * * * *